US006476660B1

(12) United States Patent
Visocchi et al.

(10) Patent No.: US 6,476,660 B1
(45) Date of Patent: Nov. 5, 2002

(54) FULLY INTEGRATED LONG TIME CONSTANT INTEGRATOR CIRCUIT

(75) Inventors: Pasqualino Michelle Visocchi, Enfield (GB); Edward J W Whittaker, Bishops Stortford (GB); Robin M Flett, Bishops Stortford (GB)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/362,610

(22) Filed: Jul. 28, 1999

(30) Foreign Application Priority Data

Jul. 29, 1998 (GB) ............................................. 9816531

(51) Int. Cl.⁷ ................................................ G06F 7/64
(52) U.S. Cl. ........................ 327/336; 327/344; 327/345
(58) Field of Search .......................... 330/59, 110, 308; 359/189, 194; 327/103, 132, 336, 344, 345

(56) References Cited

U.S. PATENT DOCUMENTS

| | | | | |
|---|---|---|---|---|
| 4,278,943 A | * | 7/1981 | Masuda et al. ............. | 328/127 |
| 4,292,598 A | | 9/1981 | Yasamura ................... | 330/281 |
| 5,014,058 A | * | 5/1991 | Horn .......................... | 341/166 |
| 5,138,277 A | | 8/1992 | Robinson et al. ........... | 330/281 |
| 5,636,048 A | | 6/1997 | Kogure et al. .............. | 359/189 |
| 5,679,953 A | | 10/1997 | Ananth et al. ............. | 250/338.1 |
| 5,838,807 A | * | 11/1998 | Andersson et al. ......... | 381/321 |
| 5,939,924 A | * | 8/1999 | Visocchi et al. ............ | 327/336 |
| 6,121,831 A | * | 9/2000 | Mack ............................. | 330/9 |
| 6,251,595 B1 | * | 6/2001 | Gordon et al. ................. | 435/6 |
| 6,362,612 B1 | * | 3/2002 | Harris ........................ | 323/312 |
| 2001/0033191 A1 | * | 10/2001 | El-Gamal .................... | 327/350 |

FOREIGN PATENT DOCUMENTS

| | | |
|---|---|---|
| CH | 529 488 A | 10/1972 |
| GB | 2 306 239 A | 4/1997 |

OTHER PUBLICATIONS

Document –Identifier: US 6362612 B1, Bandgap voltage reference circuit.*
Document –Identifier : US 200100033191 A1, All NPN class–AB log–domain integrator with supporting input and output.*
Document –Identifier: US 20010036641 A1, Methods and devices for carrying out chemical reactions.*

* cited by examiner

Primary Examiner—Tuan T. Lam
Assistant Examiner—Hiep Nguyen
(74) Attorney, Agent, or Firm—Lee, Mann, Smith, McWilliams, Sweeney & Ohlson

(57) ABSTRACT

The present invention provides a long time constant integrator circuit as part of an integrated circuit. The integrator circuit is fully integrated on chip with no external capacitive or resistive components for enhancing the circuit's time constant. It achieves a −3 dB cut-off frequency of 1.6 Hz. The circuit is realisable on a very small area of silicon being formed by a bipolar process using npn transistors, resistive and capacitive elements. The integrator circuit comprises a transconductance stage as an input to an operational amplifier. The circuit design is fully differential and employs realisable resistors and capacitors.

32 Claims, 4 Drawing Sheets

FULLY INTEGRATED LONG TIME CONSTANT INTEGRATOR CIRCUIT

FIELD OF THE INVENTION

The present invention relates to a fully integrated long time constant integrator circuit which finds application in long time constant feedback loop arrangements such as control circuits in optical receivers.

BACKGROUND TO THE INVENTION

The ever increasing demands for high capacity communications systems has seen the wide spread employment of optical fibre networks across the world. A fundamental component for such systems is a means of converting optical pulses comprising a digital bit stream into electrical signals. This component of such a system is commonly known as an optical receiver.

The operational requirements of such a receiver are very demanding. The receiver is required to exhibit a very low noise characteristic, such that it is capable of detecting very low levels of optical input in systems employing maximum optical fibre lengths, thus requiring high gain amplification for maximum sensitivity, but is conversely required to cope with high levels of optical input in systems employing short fibre lengths, thus requiring low gain amplification. As such, the optical receiver is required to have a wide dynamic range which can only be practically achieved with some form of automatic gain control (AGC). A typical integrated circuit (IC) optical receiver 10 is illustrated in block schematic form in FIG. 1. This comprises an IC (denoted by broken line 12) including a transimpedance amplifier stage (denoted by broken line 14) with an integrator in a control loop providing AGC.

As illustrated by FIG. 1, optical input power $OP_{IN}$ is converted into an electrical current $I_{IN}$ by a PIN diode photodetector 16. This current $I_{IN}$ is applied as an input to the IC optical receiver 10. The input current $I_{IN}$ is amplified by a transimpedance amplifier (Tz Amp) 18 which converts the input current $I_{IN}$ into an amplified voltage output signal $V_{OUT}$. To meet the requirement of wide dynamic range, the output voltage $V_{OUT}$ of the Tz Amp 18 which is in the form of a broadband data signal and may be considered as an ac, multi-frequency signal, is rectified or peak detected by a rectifier/peak detector 20 to provide a dc signal level $V_{REC}$ for comparison with a pre-determined dc reference voltage $V_{REF}$. The difference between the rectified/peak detected output voltage $V_{REC}$ and the reference voltage $V_{REF}$ is considered as an error signal which is amplified and integrated by a Miller Integrator 22 to provide a control signal $V_{CONTROL}$. A Miller Integrator is a well known form of integrator incorporating an active device such as a transistor amplifier. The Miller Integrator 22 is required to have a high gain, in order to ensure that the error signal approaches zero (ie in order to ensure that the difference between the rectified/peak detected output voltage $V_{REC}$ and the reference voltage $V_{REF}$ becomes zero) by means of controlling the gain of the Tz Amp by varying the impedance of a feedback resistor 24.

If the rectified/peak detected output voltage $V_{REC}$ is smaller than the dc reference voltage $V_{REF}$, then the Tz Amp 18 must operate at high gain to provide high sensitivity of the optical receiver. When the rectified/peak detected output voltage $V_{REC}$ becomes just greater than the dc reference voltage $V_{REF}$, then the on-set of AGC occurs and continues whilst the input channel $I_{IN}$ increases. When the feedback resistor 24 is at a minimum the Tz Amp is operating at very low gain and approaches an overload condition.

In addition, the Miller Integrator is required to have a long time constant (Tp) so that the effect of the AGC action of the control loop does not compromise data embedded in the voltage output signal $V_{OUT}$ of the Tz Amp.

The requirements for the time constant Tp of the Miller integrator can be better understood with reference to FIG. 2 which identifies the fundamental gain stages of the typical optical receiver of FIG. 1.

To understand the effects of the Miller Integrator time constant Tp, each gain block of the optical receiver 10 must be considered. For a first order approximation, the Tz Amp gain of the optical receiver 10 is proportional to $V_{OUT}/I_{IN}$ and can be considered as the value Rf of the feedback resistor 24. This assumes that the Tz Amp gain is constant for all frequencies up to an upper −3 dB point. This assumption is only true if the AGC is not operating which is often the case at low optical input levels. Once the AGC begins to operate to prevent the output signal $V_{OUT}$ from increasing further, this has a significant effect on the Tz Amp gain. Using standard feedback control theory, the presence of a pole in the control loop feedback path (ie Tp of the Miller Integrator) presents a zero in the forward Tz Amp gain path, reduced by a factor of the loop gain. To illustrate the above, consider the loop gain of the optical receiver as:

$$\text{Loop Gain} = Tz_o \cdot A_r \cdot A_o / Rf$$

where $Tz_o$ = Open loop gain of the Tz Amp
Rf = Value of the feedback resistor
$A_r$ = Rectifier gain
$A_o$ = Open loop gain of the Miller Integrator The forward closed loop transimpedance gain of the Tz Amp is given by:

$$Tz_{CL} = (1+sTz) \cdot Rf$$

where S = Laplace operator
and Tz = Tp/(Loop Gain)
∴ Tz = Tp·Rf/($Tz_o \cdot A_r \cdot A_o$)

Consequently, the time constant Tz in the forward Tz Amp gain path is greatly reduced by the loop gain of the control circuit. In the typical arrangement, the Miller Integrator pole position (ie Tp of the Miller Integrator) is such that it results in a transmission zero in the MHz region. This can have the undesirable effect of generating pattern dependant jitter in the broadband data stream.

In a typical scenario, for a 155 Mbit/sec data stream, the transmission zero should be at 25 KHz or below to prevent jitter in the broadband data stream, representing a time constant Tz=6.36 μsecs. Typically, $Tz_o$=4 MΩ, $A_r$=2, $A_o$=100 and Rf=50 KΩ. Consequently, the loop gain is 16000(or 84.1 dB). This requires a very long, relatively speaking, Miller Integrator time constant Tp of approximately 0.1 secs.

Using present bipolar IC technology, the maximum practicable size of resistors than can be manufactured "on chip" are in the MΩ region. For example, if a 1.5 MΩ resistor is fabricated on chip, the required value of capacitor to provide a 25 KHz high pass cut-off needs to be in the order of 67 nF. However, present bipolar IC technology allows a maximum practicable value of capacitors in the region of tens to hundreds of pF to be formed on chip. Therefore, it can be seen that to achieve the necessary high pass cut-off frequency of 25 KHz would require connection of a large size discrete component capacitor to the optical receiver integrated circuit. This normally comprises a lumped silicon device which is mounted on pads on the silicon substrate containing the integrator IC. The optical receiver IC is normally contained in a DIL package which is hermetically sealed. Experience has shown that it is the connections of the discrete component capacitor which provide the most likely points of failure of the device under test. Failed devices are normally discarded, it being extremely difficult and expensive to recover any of the constituent parts of the device for reuse. A known alternative is to connect a combination of discrete resistor and capacitor components to the optical receiver IC but this is equally undesirable for the same reasons as aforesaid.

It is also known to fabricate IC transimpedance amplifiers using BiCMOS technology. In such a case, a Field Effect Transistor (FET) can be used to provide very low current leakage of an on-chip capacitor which has been charged from the peak detection circuit thus providing the necessary long time constant. This technology allows a fully integrated IC optical receiver to be provided but at a higher cost than one provided using bipolar technology.

OBJECTS OF THE INVENTION

The invention seeks to provide a long time constant IC integrator without requiring external large value capacitor and/or resistor components.

The invention also seeks to provide a long time constant bipolar IC integrator.

The invention further seeks to provide a fully integrated circuit transimpedance amplifier for an optical receiver.

The invention further seeks to provide a transimpedance amplifier for an optical receiver which obviates some of the problems encountered with known IC transimpedance amplifiers.

SUMMARY OF THE INVENTION

The present invention provides an integrated circuit (IC) integrator consisting of an input attenuation stage followed by an operational amplifier stage configured as a Miller Integrator. A resistive element couples the output of the attenuation stage to the input of the op-amp stage. The op-amp stage has a feedback loop coupling its output to its input, said feedback loop including a capacitive element. The capacitive and resistive elements define between them a fundamental time constant CR for the circuit. However, the effect of the attenuation stage is to multiply the effect of the resistive element thereby enhancing the time constant of the circuit. The integrated circuit integrator is formed using a bipolar process using only npn devices although other bipolar technology is applicable. The integrator circuit in accordance with the invention has the potential to provide an enhanced circuit time constant which is in the order of 1000 times greater than the fundamental time constant. This is the consequence of two effects. The fundamental time constant is increased on the one hand by the gain provided by the op-amp stage and on the other hand is enhanced as a result of the attenuation achieved in the attenuation stage. In the preferred embodiment, the attenuation stage comprises a transconductant stage.

BRIEF DESCRIPTION OF THE DRAWINGS

For a better understanding of the invention and to show how the same may be carried into effect, there will now be described by way of example only a preferred embodiment with reference to the accompanying drawings of which.

DESCRIPTION OF THE INVENTION

Figure 1:
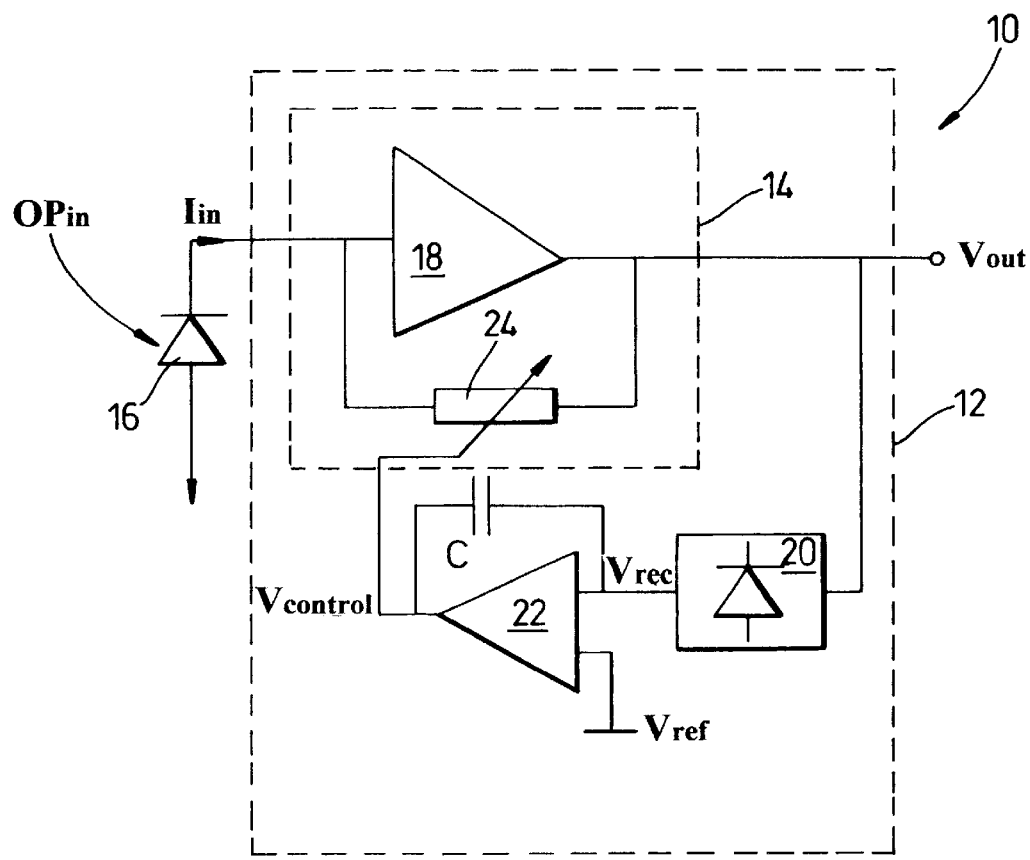
FIG. 1 is a block schematic diagram of a typical IC optical receiver with automatic gain control (AGC)
Figure 2:
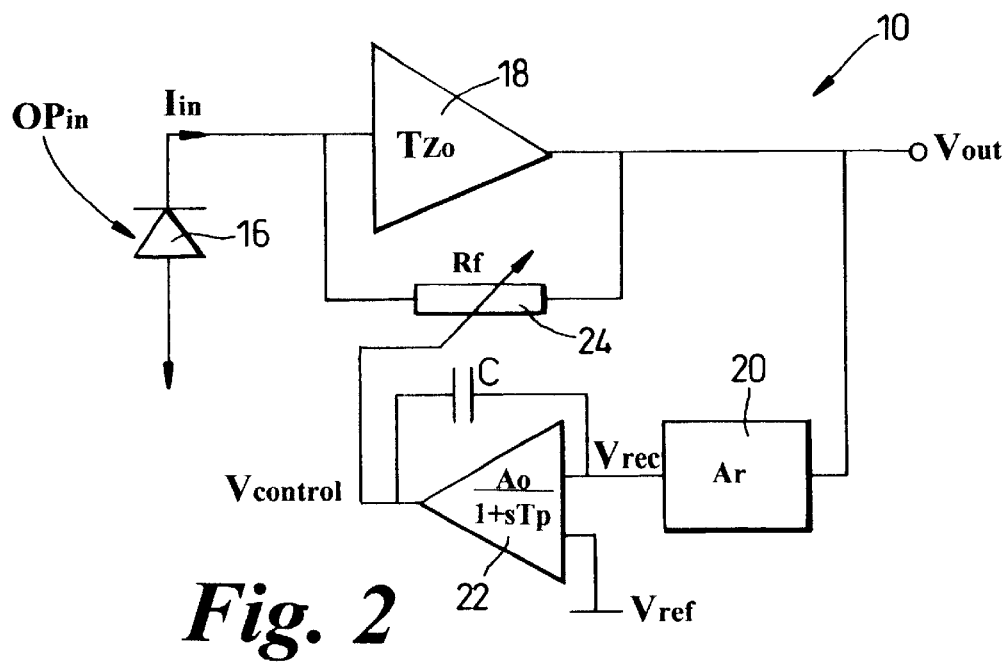
FIG. 2 is a block schematic diagram identifying the fundamental gain stages of the optical receiver of FIG. 1.
Figure 3:
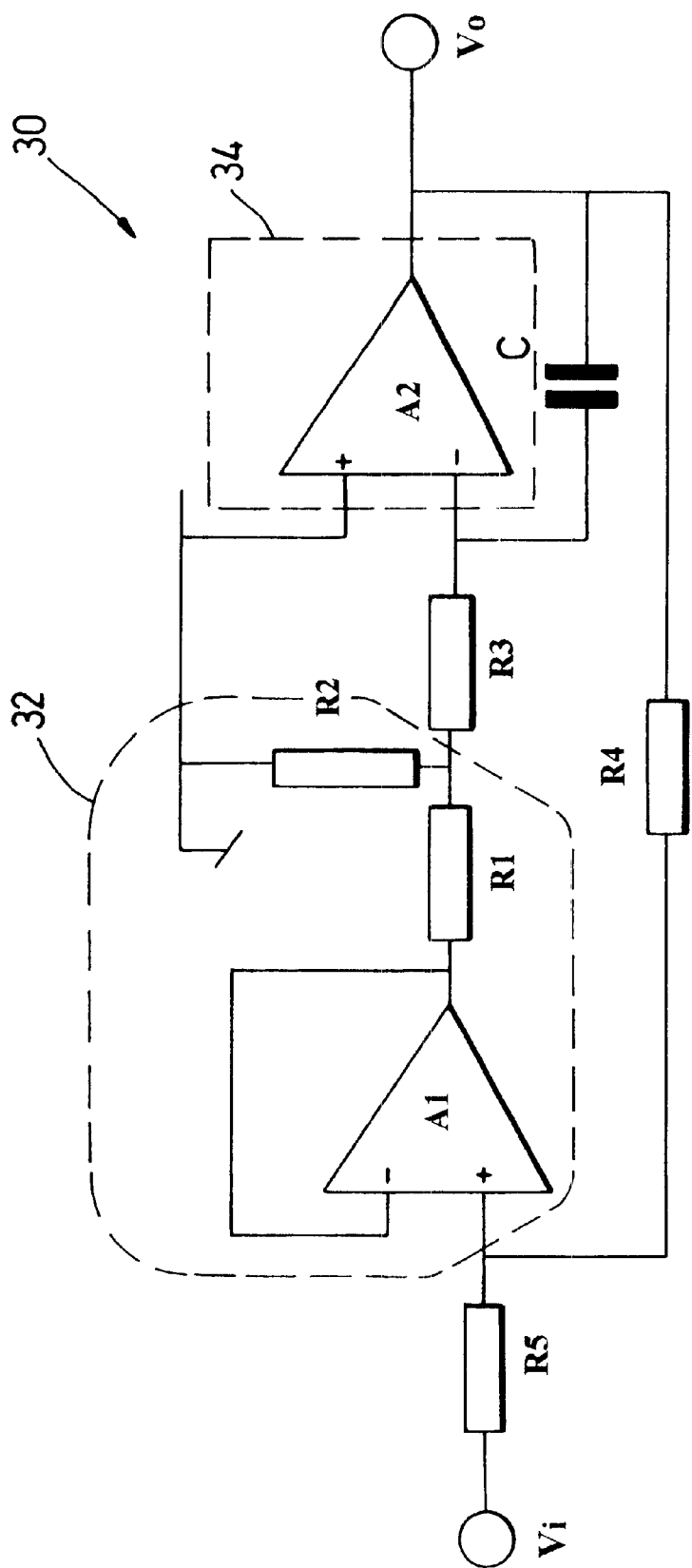
FIG. 3 is a block schematic diagram of a discrete component integrator circuit as disclosed in applicant's co-pending U.S. application Ser. No. 08/729,099 illustrating its relationship to a fully integrated circuit integrator in accordance with the invention.

Applicant's co-pending application, U.S. Ser. No. 08/729,099 (Visocchi) the contents of which are incorporated herein, discloses a "modified" Miller Integrator circuit as schematically illustrated in FIG. 3 which has the potential to provide an enhanced time constant. The Miller Integrator circuit 30 as disclosed in U.S. Ser. No. 08/729,099 has a discrete component form comprising a combination of operational amplifiers (op-amps) and other discrete circuit components. Devices such as op-amps are readily available as standard "plug-in" components.

The circuit comprises first and second op-amps A1, A2. The output of the first op-amp A1 is connected by first and second resistors R1, R2 to ground and via the first and a third resistor R1, R3 to an inverting input of the second op-amp A2. The first op-amp A1 has a feedback connection between its output and its inverting input. The second op-amp A2 is configured as a Miller Integrator. The circuit is arranged with a feedback from the output acting on the inverting input of the second op-amp A2. The feedback incorporates a capacitor C. The output of the second op-amp A2 is connected by a fourth resistor R4 to the non-inverting input of the first op-amp A1. The circuit includes a fifth resistor R5 as an input resistor.

In this circuit $$\frac{V_O}{V_{IN}} = \frac{-A_O}{1 + STp}$$

and $$Tp = C\left[R\left(\frac{1+A_O}{A}\right)\right]$$

where $$A = \frac{R2}{R1 + R2},$$

$$R = R3 + \left(\frac{R1R2}{R1 + R2}\right)$$

and Ao=R4/R5

The effect of placing an attenuation network formed by R1 & R2 within the feedback path of the two op-amps, multiplies the effect of the source resistance which is modelled by R. If the parallel combination of R1 & R2 is small in comparison to R3, then R~R3. The effect on R is multiplied by (1+Ao) but with the addition of only two resistors providing an attenuated signal, the multiplication is enhanced to (1+Ao)/A. This allows the size of discrete components to be maintained at a practicable size whilst still achieving a relatively long time constant.

This effect is also beneficial in an application such as a control loop, since closed loop zero is divided by the gain of the integrator, the modified Miller Integrator gain multiplies the time constant by (1+Ao), thus the zero Tz becomes:

$$Tz = \frac{CR(1+A_O)Rf}{Tz_o A_o A_r A}$$

This can be further reduced to:

$$Tz \sim \frac{CRRf}{Tz_o A_r A}$$

Since the effect of the high gain (ie~40 dB) of the Miller Integrator has effectively been eliminated from defining the transmission zero Tz, this has greatly reduced the required value of the fundamental CR time constant required. Thus, using in the IC example described above, where $Tz_o$=4 MΩ, Ar=2, Rf=50 K and if A is designed to give an attenuation of 0.086 (ie~−21.34 dB) then if a 1.5 MΩ resistor is fabricated on chip, the required minimum capacitor to provide a 25 KHz high pass cut-off would be 58 pF. This represents a 1,172 reduction in the size of capacitor required. Hence there is no need for any external capacitive or resistive components.

The design of such a long time constant integrator (LTI) in an integrated circuit form using bipolar technology would not use an op-amp configured as a unity gain amplifier or form an attenuation stage with a resistive divider. In addition, to ensure maximum power supply rejection and reduction of common mode noise, the LTI would be configured in a fully differential manner. The relationship between the discrete component form of the LTI and a fully integrated circuit form of the LTI is illustrated by means of dotted lines 32, 34 in FIG. 3. Dotted line 32 denotes that part of the discrete circuit which can more effectively be achieved as a transconductance stage in IC form. Dotted line 34 denotes that part of the discrete circuit that can be achieved in a standard IC op-amp configuration.

Figure 4:
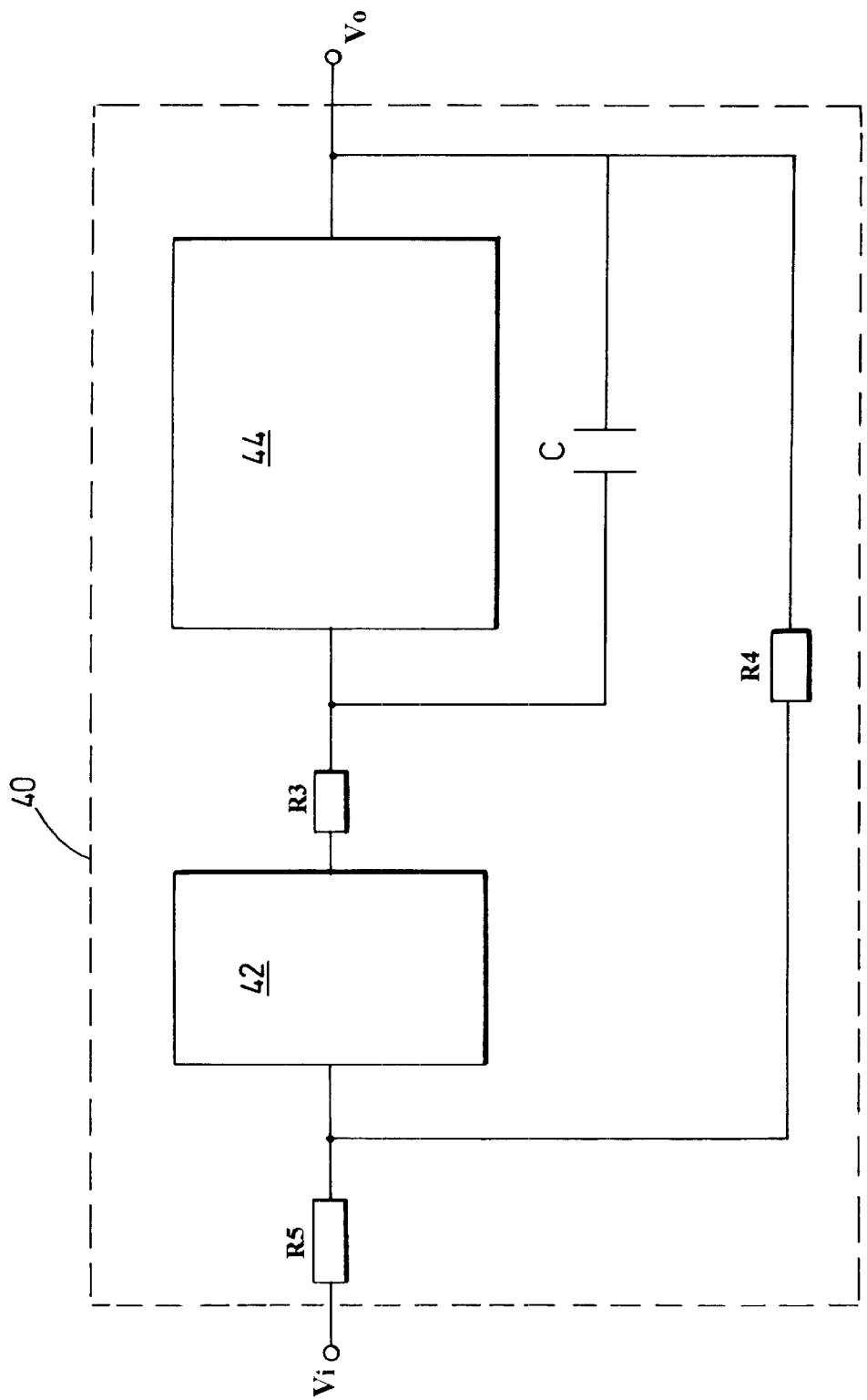
FIG. 4 is a block schematic diagram of a fully integrated circuit integrator in accordance with the invention.

The transformation to the fully integrated circuit form is further illustrated by FIG. 4 in which it can be seen that the circuit 40 comprises an input transconductance stage 42 feeding an amplifier stage 44 and including a closed loop feedback. The amplifier stage has a feedback including a capacitor C between its input and output. Other circuit elements equivalent in operation to those of the discrete circuit are denoted by the same identifiers.

Figure 5:
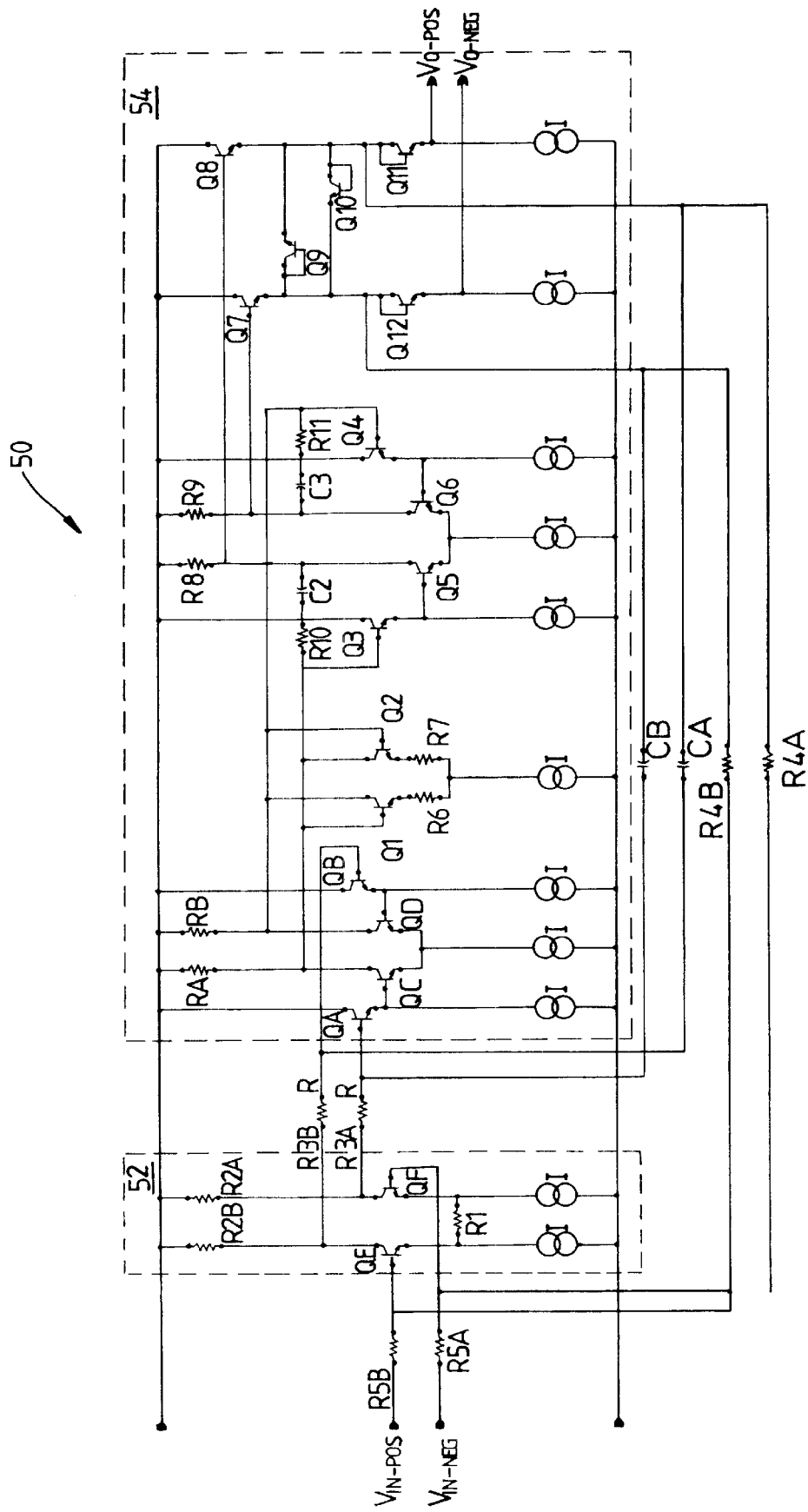
FIG. 5 is a circuit diagram for a fully integrated circuit integrator in accordance with the invention.

FIG. 5 is a circuit diagram for a preferred embodiment of the LTI.

The component values identified in FIG. 5 are given by way of example only and should not be taken as limitative of the scope of the invention.

As illustrated by FIG. 5, the LTI 50 is formed by two main parts, a transconductance input stage 52 followed by an operational amplifier (op-amp) stage 54. The closed loop voltage gain of the LTI is determined by the feedback resistors R4A, R4B and the input resistors R5A, R5B. The fundamental time constant is formed by the resistors R3A, R3B, connected between the output of the transconductance stage to the input of the op-amp stage, and the capacitors CA, CB connected between the output and input of the op-amp. The attenuation network required for the time constant multiplication is formed by the (low) voltage gain of the transconductance stage, determined by R2A, R2B and R1 (A≈2R2/R1≈0.086). The transconductance stage is provided by $Q_E$, $Q_F$, R1, R2A and R2B.

The op-amp stage has an active gain stage formed by $Q_A$, $Q_B$, $Q_C$, $Q_D$, $R_A$ and $R_B$ and is required to have a high input impedance in order that the time constant resistance formed by R3A, R3B is not lowered. In addition, low input current (base currents) must be maintained to ensure low voltage drop across R3A, R3B which are each made 1.5 MΩ in value. The op-amp is also required to provide high open loop gain in order that there is sufficient gain remaining after the attenuation stage that a closed loop gain of about 40 dB can be maintained. This can be achieved by the use of pnp transistors or in the case of the circuit of FIG. 5 by the use of an active positive feedback to enhance open loop gain. The active positive feedback is formed by the network of Q1, Q2 and R6, R7. The output of the active gain stage is followed by a secondary gain stage configured as a buffered long tail pair formed by Q3, Q4, Q5, Q6, R8 and R9. The resistive capacitor network formed by R10, C2 and R11, C3 is used for stability. The output drive of the op-amp is an emitter follower stage formed by Q7, Q8. The diodes formed by Q9, Q10 ensure that the output voltage swing is restricted to ±vbe. The diodes formed by Q11, Q12 provide the required common mode voltage to bias the next stage. It is important to note that the design of the op-amp stage of the LTI is important for the correct operation of the circuit but does not in itself constitute the novel aspect of the present invention. Other op-amp designs would be equally applicable as would be apparent to a skilled man.

The LTI of FIG. 5 provides a voltage gain of 40 dB and an effective time constant of 99.5 mS (ie a low pass cut-off of 1.6 Hz) while only employing a maximum resistor of 1.5 MΩ and a maximum on-chip capacitor of 58 pF, which ordinarily would provide a fundamental time constant of 87 μS. Consequently, the circuit design of the present invention is such that a 1144 times increase in the effective time constant over that which would seem possible with a fully integrated on-chip circuit using present bipolar technology. By using a high performance bipolar technology and providing a very long time constant integrator, both high performance and low cost optical receivers can be achieved.

It will be understood by a skilled man that the techniques of using Miller Integrator stages and attenuator stages to achieve enhanced time constants can be employed in other IC technologies such as BiCMOS, GaAsFET for example.

What is claimed is:

1. An integrated circuit (IC) integrator comprising:
   an attenuation stage;
   an amplifier stage;
   a resistive element R coupling the output of the attenuation stage to the input of the amplifier stage; and
   a capacitive element C in a feedback loop coupling the output to the input of the amplifier stage, the capacitive and resistive elements defining between them a fundamental time constant CR, whereby the attenuation stage is arranged to attenuate an input signal thereby enhancing the effective time constant of the circuit, and
   a feedback loop coupling the output of the amplifier stage to the input of the attenuation stage, said feedback loop including an additional resistive element.

2. An integrated circuit integrator as claimed in claim 1, wherein the attenuation stage comprises an input transconductance stage.

3. An integrated circuit integrator as claimed in claim 1 or claim 2, wherein the amplifier stage comprises an operational amplifier.

4. An integrated circuit integrator as claimed in claim 3 wherein the operational amplifier is configured as a Miller Integrator.

5. An integrated circuit integrator as claimed in claim 1 or 2, wherein the IC is manufactured by a bipolar IC process.

6. An integrated circuit integrator as claimed in claim 1 or 2, wherein the elements of the circuit comprise npn devices.

7. An integrated circuit integrator as claimed in claim 1 or 2, wherein the circuit is fully differential.

8. An integrated circuit integrator as claimed in claim 2, wherein the input transconductance stage includes a resistive divider network comprising a first resistive element coupling the output of the attenuation stage to the resistive element R and a second resistive element coupling the resistive element R and ground, wherein the first resistive element has a value considerably greater than that of the second resistive element.

9. An integrated circuit integrator as claimed in claims 1, 2 or 8, wherein the circuit includes an input resistive element on an input side of the junction of the feedback loop with the input of the transconductance stage.

10. An integrated circuit transimpedance amplifier including an integrator circuit according to claims 1, 2 or 8.

11. An optical receiver including an integrated circuit (IC) integrator comprising:
an attenuation stage;
an amplifier stage;
a resistive element R coupling the output of the attenuation stage to the input of the amplifier stage;
a capacitive element C in a feedback loop coupling the output to the input of the amplifier stage, the capacitive and resistive elements defining between them a fundamental time constant CR, whereby the attenuation stage is arranged to attenuate an input signal thereby enhancing the effective time constant of the circuit, and
a feedback loop coupling the output of the amplifier stage to the input of the attenuation stage, said feedback loop including an additional resistive element.

12. An integrated circuit (IC) integrator comprising:
an attenuation stage;
an amplifier stage;
a resistive element R coupling the output of the attenuation stage to the input of the amplifier stage;
a capacitive element C in a feedback loop coupling the output to the input of the amplifier stage, the capacitive and resistive elements defining between them a fundamental time constant CR, whereby the attenuation stage is arranged to attenuate an input signal thereby enhancing the effective time constant of the circuit,
wherein the attenuation stage comprises an input transconductance stage a resistive driver network
wherein the resistive divider network comprising a first resistive element coupling the output of the input transconductance stage to the resistive element R and a second resistive element coupling the resistive element R and ground, wherein the first resistive element has a value considerably greater than that of the second resistive element.

13. An integrated circuit integrator as claimed in claim 12, wherein the amplifier stage comprises an operational amplifier.

14. An integrated circuit integrator as claimed in claim 13, wherein the operational amplifier is configured as a Miller Integrator.

15. An integrated circuit integrator as claimed in claim 12, wherein the IC is manufactured by a bipolar IC process.

16. An integrated circuit integrator as claimed in claim 12, wherein the elements of the circuit comprise npn devices.

17. An integrated circuit integrator as claimed in claim 12, wherein the circuit is fully differential.

18. An integrated circuit integrator as claimed in claim 12, wherein it includes a feedback loop coupling the output of the amplifier stage to the input of the transconductance stage, said feedback loop including a resistive element.

19. An integrated circuit integrator as claimed in claim 12, wherein the circuit includes an input resistive element on an input side of the junction of the feedback loop with the input of the transconductance stage.

20. An integrated circuit transimpedance amplifier including an integrator circuit according to claim 12.

21. An optical receiver including an integrated circuit (IC) integrator comprising:
an attenuation stage;
an amplifier stage;
a resistive element R coupling the output of the attenuation stage to the input of the amplifier stage;
a capacitive element C in a feedback loop coupling the output to the input of the amplifier stage, the capacitive and resistive elements defining between them a fundamental time constant CR, whereby the attenuation stage is arranged to attenuate an input signal thereby enhancing the effective time constant of the circuit.

22. An integrated circuit (IC) integrator comprising:
an attenuation stage;
an amplifier stage;
a resistive element R coupling the output of the attenuation stage to the input of the amplifier stage;
a capacitive element C in a feedback loop coupling the output to the input of the amplifier stage, the capacitive and resistive elements defining between them a fundamental time constant CR, whereby the attenuation stage is arranged to attenuate an input signal thereby enhancing the effective time constant of the circuit,
and wherein the integrated circuit integrator includes an input resistive element coupling an input side of the junction of the feedback loop to the input of the attenuation stage.

23. An integrated circuit integrator as claimed in claim 22, wherein the attenuation stage comprises an input transconductance stage.

24. An integrated circuit integrator as claimed in claim 22, wherein the amplifier stage comprises an operational amplifier.

25. An integrated circuit integrator as claimed in claim 24, wherein the operational amplifier is configured as a Miller Integrator.

26. An integrated circuit integrator as claimed in claim 22, wherein the IC is manufactured by a bipolar IC process.

27. An integrated circuit integrator as claimed in claim 22, wherein the elements of the circuit comprise npn devices.

28. An integrated circuit integrator as claimed in claim 22, wherein the circuit is fully differential.

29. An integrated circuit integrator as claimed in claim 23, wherein the transconductance stage includes a resistive divider network comprising a first resistive element coupling the output of an attenuation stage to the resistive element R and a second resistive element coupling the resistive element R and ground, wherein the first resistive element has a value considerably greater than that of the second resistive element.

30. An integrated circuit integrator as claimed in claim 22, wherein it includes a feedback loop coupling the output of the amplifier stage to the input of the transconductance stage, said feedback loop including a resistive element.

31. An integrated circuit transimpedance amplifier including an integrator circuit according to claim 22.

32. An optical receiver including an integrated circuit (IC) integrator comprising:

an attenuation stage;

an amplifier stage;

a resistive element R coupling the output of the attenuation stage to the input of the amplifier stage;

a capacitive element C in a feedback loop coupling the output to the input of the amplifier stage, the capacitive and resistive elements defining between them a fundamental time constant CR, whereby the attenuation stage is arranged to attenuate an input signal thereby enhancing the effective time constant of the circuit, and wherein the integrated circuit integrator includes an input resistive element coupling an input side of the junction of the feedback loop to the input of the attenuation stage.

* * * * *